(12) United States Patent
Malladi et al.

(10) Patent No.: US 9,812,447 B2
(45) Date of Patent: Nov. 7, 2017

(54) BIPOLAR JUNCTION TRANSISTORS WITH EXTRINSIC DEVICE REGIONS FREE OF TRENCH ISOLATION

(71) Applicant: GLOBALFOUNDRIES INC., Grand Cayman (KY)

(72) Inventors: Ramana Malladi, Essex Junction, VT (US); Renata Camillo-Castillo, Essex Junction, VT (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 15/013,393

(22) Filed: Feb. 2, 2016

(65) Prior Publication Data

US 2017/0221887 A1    Aug. 3, 2017

(51) Int. Cl.
| | | |
|---|---|---|
| *H01L 29/737* | (2006.01) | |
| *H01L 27/082* | (2006.01) | |
| *H01L 21/8228* | (2006.01) | |
| *H01L 29/66* | (2006.01) | |
| *H01L 29/161* | (2006.01) | |
| *H01L 29/165* | (2006.01) | |
| *H01L 23/66* | (2006.01) | |

(52) U.S. Cl.
CPC .... *H01L 27/0826* (2013.01); *H01L 21/82285* (2013.01); *H01L 23/66* (2013.01); *H01L 29/161* (2013.01); *H01L 29/165* (2013.01); *H01L 29/66242* (2013.01); *H01L 29/7378* (2013.01)

(58) Field of Classification Search
CPC ............. H01L 29/1004; H01L 29/0649; H01L 29/0804; H01L 29/41708; H01L 2924/1305; H01L 29/42304; H01L 29/66242; H01L 29/66272; H01L 29/73; H01L 29/0817; H01L 29/737
See application file for complete search history.

(56) References Cited

U.S. PATENT DOCUMENTS

| | | | | |
|---|---|---|---|---|
| 4,107,721 | A * | 8/1978 | Miller ................... | H01L 31/111 257/462 |
| 4,212,023 | A * | 7/1980 | Chu ....................... | H01L 31/1105 250/551 |
| 6,830,982 | B1 * | 12/2004 | Howard ............... | H01L 21/8249 257/E21.371 |
| 7,807,539 | B1 * | 10/2010 | Sutardja .............. | H01L 29/0804 257/E21.35 |
| 8,227,832 | B2 | 7/2012 | Chiu et al. | |
| 9,916,446 | | 12/2014 | Camillo-Castillo et al. | |
| 2004/0188797 | A1 | 9/2004 | Khater et al. | |
| 2011/0012129 | A1 * | 1/2011 | Zhang ................. | H01L 21/8213 257/77 |

(Continued)

FOREIGN PATENT DOCUMENTS

| | | |
|---|---|---|
| EP | 2784822 | 1/2014 |
| WO | 2006129292 | 12/2006 |

*Primary Examiner* — Khiem D Nguyen
(74) *Attorney, Agent, or Firm* — Anthony Canale; Thompson Hine LLP (57) ABSTRACT

Device structures and fabrication methods for a device structure. One or more trench isolation regions are formed in a substrate to surround a device region. A base layer is formed on the device region. First and second emitter fingers are formed on the base layer. A portion of the device region extending from the first emitter finger to the second emitter finger is free of dielectric material.

16 Claims, 5 Drawing Sheets

(56) References Cited

U.S. PATENT DOCUMENTS

| | | | |
|---|---|---|---|
| 2011/0186841 A1* | 8/2011 | Meunier-Bellard | H01L 21/8249 257/51 |
| 2012/0138924 A1* | 6/2012 | Nishihori ................ | H01L 22/30 257/48 |
| 2013/0277804 A1* | 10/2013 | Cheng ............... | H01L 29/66287 257/586 |
| 2016/0372396 A1* | 12/2016 | Ding .................... | H01L 23/367 |
| 2016/0372548 A1* | 12/2016 | Ding .................. | H01L 29/0813 |

* cited by examiner

BIPOLAR JUNCTION TRANSISTORS WITH EXTRINSIC DEVICE REGIONS FREE OF TRENCH ISOLATION

BACKGROUND

The invention relates generally to semiconductor devices and integrated circuit fabrication and, in particular, to fabrication methods and device structures for bipolar junction transistors and heterojunction bipolar transistors.

Bipolar junction transistors may be found, among other end uses, in radiofrequency transceivers, multi-gigabit analog-to-digital converters, optical networks, automotive radar, and high-speed circuits. Bipolar junction transistors may be combined with complementary metal-oxide-semiconductor (CMOS) field effect transistors in bipolar complementary metal-oxide-semiconductor (BiCMOS) integrated circuits, which take advantage of the favorable characteristics of both transistor types.

Bipolar junction transistors are three-terminal electronic devices that include an emitter, a base, and a collector arranged such that the base is situated between the emitter and collector. An NPN bipolar junction transistor may include n-type semiconductor material regions constituting the emitter and collector, and a region of p-type semiconductor material constituting the base. A PNP bipolar junction transistor includes p-type semiconductor material regions constituting the emitter and collector, and a region of n-type semiconductor material constituting the base. In operation, the base-emitter junction is forward biased and the base-collector junction is reverse biased. The collector-emitter current may be controlled by the base-emitter voltage.

A heterojunction bipolar transistor (HBT) is a variety of bipolar junction transistor in which two or more of the emitter, intrinsic base, and/or collector are composed of semiconductor materials with unequal band gaps, which creates heterojunctions. For example, the collector and/or emitter of a heterojunction bipolar transistor may be composed of silicon, and the base of a heterojunction bipolar transistor may be composed of silicon germanium, which is characterized by a narrower band gap than silicon. In a wireless design, the interfaces between the antenna and the electronic circuits are provided by a low-noise amplifier (LNA) and a power amplifier (PA), each of which may include a heterojunction bipolar transistor with a SiGe base.

Improved fabrication methods and device structures are needed for bipolar junction transistors and heterojunction bipolar transistors.

SUMMARY

In an embodiment of the invention, a method is provided for fabricating a device structure. One or more trench isolation regions are formed in a substrate to surround a device region. A base layer is formed on the device region. First and second emitter fingers are formed in a spaced relationship on the base layer. A portion of the device region extending from the first emitter finger to the second emitter finger is free of dielectric material.

In an embodiment of the invention, a device structure includes one or more trench isolation regions in a substrate. The one or more trench isolation structures surround a device region. The device structure further includes a base layer on the device region, as well as first and second emitter fingers disposed in a spaced relationship on the base layer. A portion of the device region extending from the first emitter finger to the second emitter finger is free of dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
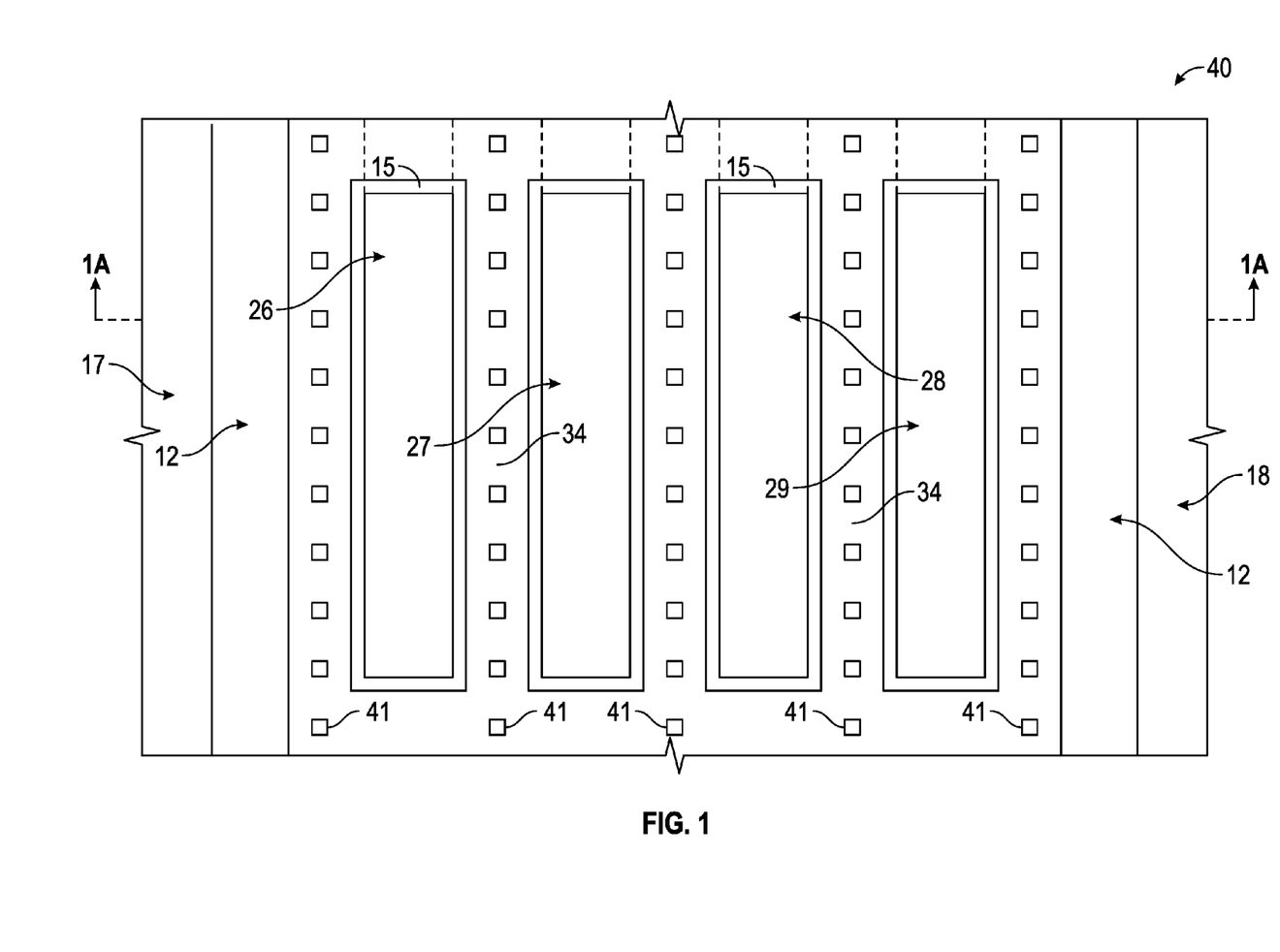
FIG. 1 is a top view of a portion of a substrate at an initial fabrication stage of a processing method for fabricating a device structure in accordance with an embodiment of the invention.
Figure 1A:
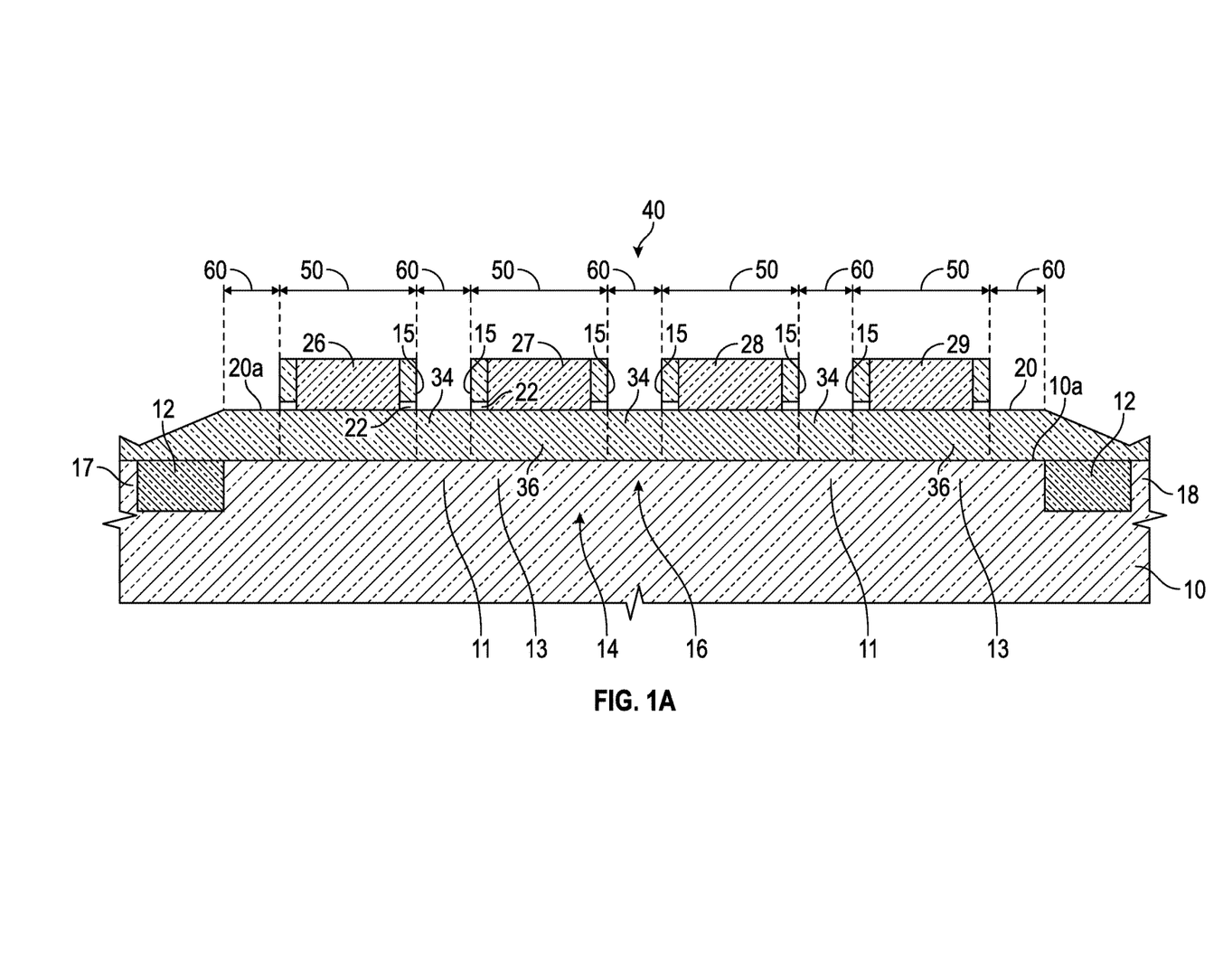
FIG. 1A is a cross-sectional view taken generally along line 1A-1A in FIG. 1.

With reference to FIGS. 1, 1A and in accordance with an embodiment of the invention, a substrate 10 comprises a single-crystal semiconductor material usable to form the devices of an integrated circuit. The semiconductor material constituting the substrate 10 may include an epitaxial layer at its top surface 10a, which may contain an amount of an electrically-active dopant that enhances its electrical properties relative to the remainder of the substrate 10. For example, the substrate 10 may include an epitaxial layer of single crystal silicon that is doped with a concentration of, in a construction for an NPN transistor, an n-type dopant from Group V of the Periodic Table (e.g., phosphorus (P), arsenic (As), or antimony (Sb)) in a concentration effective to impart n-type conductivity.

Trench isolation regions 12 are located in the semiconductor material of the substrate 10. A device region 14 used in fabricating a device structure is bounded by the trench isolation regions 12. The device region 14 is comprised of a portion of the semiconductor material of the substrate 10. The trench isolation regions 12 extend from the top surface 10a of the substrate 10 to a shallow depth beneath the top surface 10a.

The trench isolation regions 12 may be formed by depositing a hardmask, patterning the hardmask and substrate 10 with lithography and etching processes to define trenches, depositing an electrical insulator to fill the trenches, planarizing the electrical insulator relative to the hardmask using a chemical mechanical polishing (CMP) process, and removing the hardmask. In one embodiment, the trench isolation regions 12 may be comprised of silicon dioxide ($SiO_2$) deposited by chemical vapor phase deposition (CVD). The trench isolation regions 12 may comprise shallow trench isolation regions and/or deep trench isolation regions.

A collector 16, which may be comprised of a section or all of the material of the device region 14, is located between the trench isolation regions 12. The collector 16 may contain a concentration of an n-type dopant in a concentration that is effective to impart n-type conductivity to its semiconductor material. The collector contact regions 17, 18 are coupled with the collector 16 by portions of the semiconductor material of the substrate 10 extending beneath the trench isolation regions 12. The collector contact regions 17, 18 are positioned adjacent to the collector 16, and are laterally separated from the collector 16 by the trench isolation regions 12.

A base layer 20 of a given thickness is located on the top surface of substrate 10 in the device region 14. The base layer 20 is positioned in vertical alignment with the device region 14 and that directly contacts the single crystal semiconductor material of the device region 14. The base layer 20 defines an intrinsic base that participates in forming an emitter-base junctions of the device structure.

The base layer 20 may be comprised of a different semiconductor material than the device region 14 and may have an opposite conductivity type from the collector 16. For example, the base layer 20 may be comprised of a semiconductor material, such as silicon-germanium (SiGe) in an alloy with a content of silicon (Si) ranging from 95 atomic percent to 50 atomic percent and a content of germanium (Ge) ranging from 5 atomic percent to 50 atomic percent. The germanium content of the base layer 20 may be uniform across the thickness of base layer 20 or may be graded and/or stepped across the thickness of base layer 20. The semiconductor material of the base layer 20 may comprise a dopant, such as a p-type dopant selected from Group III of the Periodic Table (e.g., boron (B)) in a concentration that is effective to impart p-type conductivity and, optionally, carbon (C) to suppress diffusion of the p-type dopant.

The base layer 20 may be formed on a top surface of the device region 14 and may be comprised of single crystal semiconductor material (e.g., single crystal silicon-germanium). The semiconductor material comprising base layer 20 may be epitaxially grown using a low temperature epitaxial (LTE) growth process, such as vapor phase epitaxy (VPE). During deposition, the crystal structure of the single crystal semiconductor material of the device region 14 serves as a template for epitaxial growth. The growth of the base layer 20 is not retarded in extrinsic device regions 60 between adjacent emitters because the semiconductor material is epitaxially grown directly on the device region 14 and not on trench isolation regions interior to the outer boundary or perimeter of the device region 14. The result is a thickened single crystal growth in the extrinsic device regions 60, which may reduce the extrinsic base resistance.

The base layer 20 lacks the variations in topography normally observed in device structures that include interior trench isolation regions used to isolate adjacent emitters and to divide the device region 14 into different sections each dedicated on one of the emitters. The base layer 20 in intrinsic device regions 50 and in the extrinsic device regions 60 is comprised of single crystal semiconductor material. The absence of trench isolation regions in the extrinsic device region results in the growth of single crystal semiconductor material instead of polycrystalline semiconductor material of a lesser thickness that is observed to form on the dielectric material of trench isolation regions. Another benefit arising from the absence of trench isolation regions is that the base layer 20 lacks facets characteristic of transitions from single crystal semiconductor material to polycrystalline semiconductor material inside the outer boundary of the device region 14. The reliability of the device structure may be improved by the elimination of these facets within the outer boundary of the device region 14.

A dielectric layer is deposited and patterned to form pads 22 on a top surface 20a of the base layer 20. The pads 22, which may be comprised of silicon dioxide, are utilized when subsequently forming emitter windows. One or more dielectric layers are deposited on the top surface 20a of the base layer 20 and the pads 22, and patterned to form emitter openings that extend through the dielectric layers and the pads 22 to reach the top surface 20a of the single crystal semiconductor material comprising the base layer 20. The one or more dielectric layers may be comprised of one or more electrical insulators, such as silicon nitride ($Si_3N_4$), silicon dioxide, and/or other materials deposited using chemical vapor deposition. The emitter openings may be formed by patterning the one or more dielectric layers with photolithography and etching processes.

An emitter comprised of emitter fingers 26-29 are formed in the respective emitter openings, and are disposed as parallel structural elements with a spaced relationship. The single crystal semiconductor material of the base layer 20 is located vertically between the emitter fingers 26-29 and the collector 16.

The emitter fingers 26-29 may be formed from a layer of heavily-doped semiconductor material that is deposited such that portions fill the emitter openings and then is patterned using lithography and etching processes. For example, the emitter fingers 26-29 may be comprised of polysilicon or polycrystalline silicon-germanium deposited by chemical vapor deposition and heavily doped with a concentration of a dopant, such as an impurities species from Group V of the Periodic Table, such as phosphorus (P) or arsenic (As), effective to impart n-type conductivity. Non-conductive spacers 15 clad the emitter fingers 26-29 and may be formed during the process forming the emitter.

Sections of an extrinsic base 34 may be formed in sections of the base layer 20 by the controlled introduction of a dopant that operates to increase its electrical conductivity relative to the remainder of the base layer 20. In an embodiment, the sections of the extrinsic base 34 may be formed by ion implantation and, specifically, by implanting ions of a p-type dopant selected from Group III of the Periodic Table (e.g., boron) in a concentration that is effective to elevate the level of p-type conductivity relative to the remainder of the base layer 20. The ion species, as well as dose and kinetic energy of the ions, may be selected to provide the desired concentration. The emitter fingers 26-29 provide self-alignment of the dopant introduction so that the sections of the base layer 20 forming the sections of the extrinsic base 34 are located between adjacent emitter fingers 26-29 and at the periphery of the base layer 20. The sections of the extrinsic base 34 may be contacted at these locations. The sections of the base layer 20 beneath the emitter fingers 26-29, which do not receive a concentration of the dopant, define sections of an intrinsic base 36.

The sections of the extrinsic base 34 and the sections of the intrinsic base 36 are laterally juxtaposed in an alternating fashion within the base layer 20. A portion 11 of the device region 14 and/or collector 16 is aligned with each section of the base layer 20 forming a section of the extrinsic base 34. These portions 11 of the device region 14 and/or collector 16 are free of dielectric material, e.g., free of dielectric material embedded in the semiconductor material that would be characteristic of trench isolation regions. A portion 13 of the device region 14 and/or collector 16 is aligned with each section of the base layer 20 forming a section of the intrinsic base 36. These portions 13 of the device region 14 and/or collector 16 are also free of dielectric material, e.g., free of dielectric material embedded in the semiconductor material that would be characteristic of trench isolation regions. The portions 11 and the portions 13 are laterally juxtaposed in an alternating fashion within the base layer 20.

The device structure 40 has a vertical architecture in which the collector 16, the single crystal semiconductor material of the sections of the intrinsic base 36, and the emitter finger 26-29 are vertically arranged. The conductivity type of the semiconductor material constituting the base layer 20 and the sections of the intrinsic base 36 is opposite to the conductivity type of the semiconductor materials constituting the emitter fingers 26-29 and the collector 16. The device structure 40 may be characterized as a heterojunction bipolar transistor if two or all three of the collector 16, the sections of the intrinsic base 36, and the emitter fingers 26-29 are comprised of different semiconductor materials. An emitter-base junction is defined at the interface between each of the emitter fingers 26-29 and its respective section of the intrinsic base 36 so that the device structure effectively includes multiple junctions that contribute to the emitter-base junction. A base-collector junction is defined at the interface between the collector 16 and the base layer 20 so that the device structure 40 includes only a single base-collector junction that is comprised entirely of single crystal semiconductor materials. This single base-collector junction contrasts with device constructions that include trench isolation regions with multiple base-collector junctions connected by a common collector and in which the extrinsic base has an interface with the dielectric material of trench isolation regions.

Middle-of-line (MOL) processing and back-end-of-line (BEOL) processing follows, which includes silicidation, formation of dielectric layers, via plugs, and wiring for an interconnect structure coupled by the local interconnect structure with the bipolar junction transistor, as well as other similar contacts for additional device structures like device structure 40 and CMOS transistors included in other circuitry fabricated on the substrate 10. At least one row of base contacts 41 is located between each pair of emitter fingers 26-29 and at the peripheral side edges of each of the cells. The base contacts 41 land on the sections of the extrinsic base 34, which may be silicided at their top surfaces. Additional contacts (not shown) are formed that contact the emitter fingers 26-29 and the collector contact regions 17, 18. In an embodiment, one or more of the emitter fingers 26-29 may be dummy emitters that are not contacted during middle-of-line processing.

Due to the absence of trench isolation regions, the device structure 40 lacks a device region associated with each of the emitter fingers 26-29 such that the number of device regions is equal to the number of emitter fingers 26-29. Instead, the device structure 40 includes a single device region 14 associated with all of the emitter fingers 26-29.

The device structure 40 can be divided into intrinsic device regions 50 coinciding with the portions of the collector 16, the intrinsic base 36 of base layer 20, and the emitter fingers 26-29 participating in junctions and extrinsic device regions 60 outside of the intrinsic device regions 50. One of the extrinsic device regions 60 is located between each adjacent pair of intrinsic device regions 50 and, therefore, between each adjacent pair of emitter fingers 26-29 that are nearest neighbors. Portions 11 of the device region 14 and/or collector 16 is generally aligned with the extrinsic device regions 60, and portions 13 of the device region 14 and/or collector 16 is generally aligned with the intrinsic device regions 50. The elimination of trench isolation regions in the extrinsic device regions 60 eliminates, for the most part, the component of capacitance attributable to the extrinsic base-isolation dielectric-collector by eliminating the dielectric material of trench isolations that would be conventionally situated in the device region 14 between the extrinsic base 34 and the collector 16.

The increased thickness of the extrinsic base in the extrinsic device regions may cause a faster decrease in the extrinsic base dopant profile at the outer perimeter of the collector. The tail of the concentration profile for the implanted dopant may be spaced a greater distance from the collector while still introducing a sufficient dopant concentration into the base layer to provide the needed increase in electrical conductivity characterizing the extrinsic base. This may reduce the perimeter collector-intrinsic base capacitance, which in turn may improve high frequency performance and transit times. The base resistance may also be reduced by the increased thickness of the base layer in the extrinsic device region.

The improved performance of the device structure 40 from eliminating the trench isolation regions in the extrinsic device regions may be evidenced by improvements in figures of merit, such as increases in the peak cut-off frequency $f_T$ and the peak maximum oscillation frequency $f_{max}$. The elimination of the trench isolation regions in the extrinsic device regions may also broaden the cut-off frequency $f_T$ and maximum oscillation frequency $f_{max}$ curves, i.e., a higher cut-off frequency $f_T$ and a higher maximum oscillation frequency $f_{max}$ may be exhibited at higher currents. The improvements to the cut-off frequency $f_T$ and maximum oscillation frequency $f_{max}$ curves may be provided without increasing the collector doping. The elimination of the trench isolation regions in the extrinsic device regions may increase the cut-off frequency $f_T$ without affecting the breakdown voltage.

Any limitation of the emitter finger spacing based on the presence of trench isolation regions inside the device region is eliminated, which may permit a reduced footprint for the device structure. The elimination of the trench isolation regions may reduce heat confinement and elevate heat dissipation from the device structure because of the elimination of the dielectric material of low thermal conductivity. The improvement in heat dissipation is may lead to a reduced probability for thermal runaway issues due to Joule heating of the emitter fingers and may permit the use of a smaller ballast resistor. The elimination of the trench isolation regions may improve geometrical scaling of the device structure because of the absence of stress normally associated with trench isolation regions. The trench isolation regions may be eliminated without any added masks in the process flow.

Device structures were fabricated and tested in which the baseline device structure was a SiGe heterojunction bipolar transistor with 4 emitter fingers, and was designed to operate at a peak cutoff frequency of 25 GHZ and a maximum frequency of 100 GHz as nominal figures of merit. The device construction was similar to the constructions for device structures shown and discussed herein in which the trench isolation regions are eliminated inside the outer perimeter of the device region. For comparison, nominally identical device structures were fabricated that included trench isolation regions in the semiconductor material of the device region interior of the collector contact regions and between adjacent pairs of emitter fingers. The device AC performance was extracted using two port S-parameter measurements with standard Load-Reflect-Reflect-Match (LRRM) calibration and open and short de-embedding to remove parasitic impedances associated with measurement cables, probes, wiring and pads.

Figure 2:
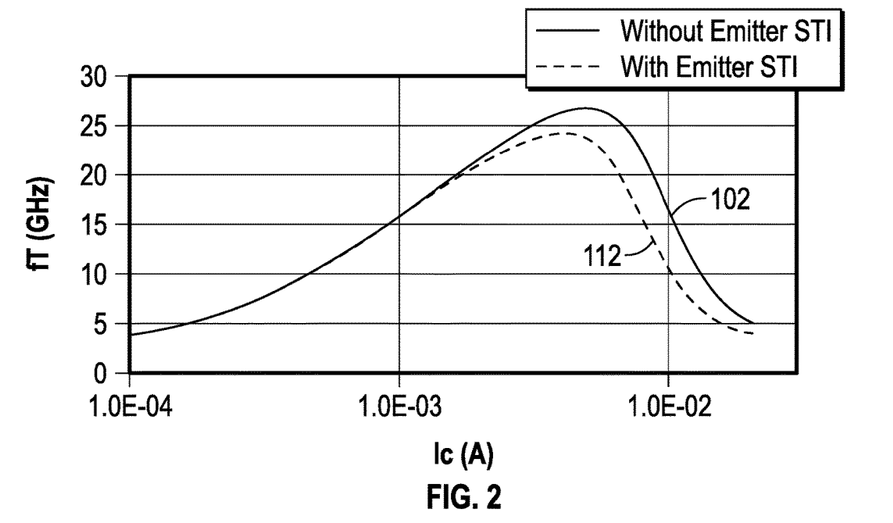
FIG. 2 is a graph plotting cutoff frequency for a device structure fabricated in accordance with an embodiment of the invention and a device structure fabricated in accordance with the prior art.

FIG. 2 is a graph plotting cutoff frequency as a function of collector current for a device structure lacking trench isolation regions in accordance with an embodiment of the invention (curve 102) and a device structure device structure including trench isolation regions in accordance with the prior art (curve 112). Curve 102 is observed to exhibit a peak cutoff frequency that is greater than the peak cutoff frequency in curve 112. In addition, the width of curve 102 near the peak cutoff frequency is broader (i.e., wider) than the width of curve 112 near the peak cutoff frequency. Specifically, the peak cutoff frequency is observed to be about 10% higher in curve 103 than curve 112, and the peak collector current (related to the increased breadth) is observed to increase by 22%.

Figure 3:
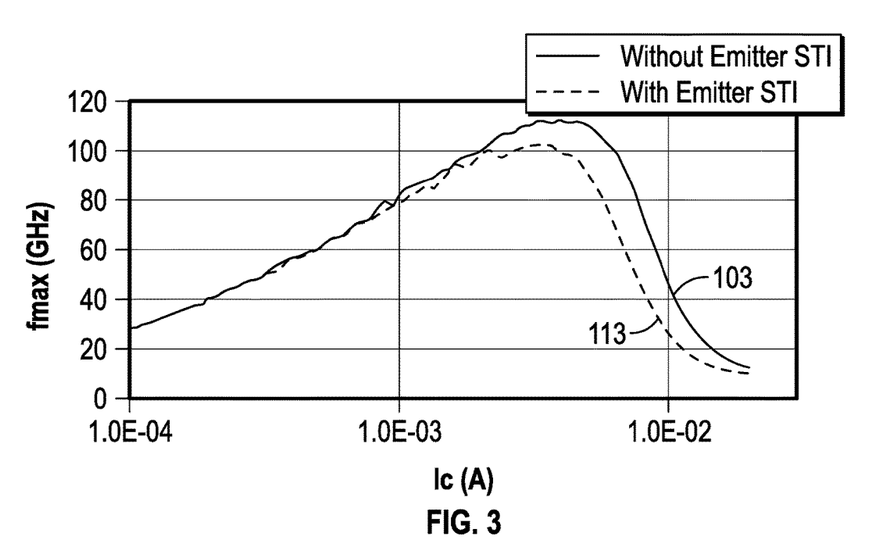
FIG. 3 is a graph plotting maximum oscillation frequency as a function of collector current for a device structure fabricated in accordance with an embodiment of the invention and a device structure fabricated in accordance with the prior art.

FIG. 3 is a graph plotting maximum oscillation frequency as a function of collector current for a device structure lacking trench isolation regions in accordance with an embodiment of the invention (curve 103) and a device structure including trench isolation regions in accordance with the prior art (curve 113). Curve 103 is observed to exhibit a peak maximum oscillation frequency that is greater than the peak maximum oscillation frequency in curve 113. In addition, the width of curve 103 near the peak maximum oscillation frequency is broader (i.e., wider) than the width of curve 113 near the peak maximum oscillation frequency. In the device structure in which trench isolation regions are absent, the cut-off frequency $f_T$ in curve 103 is perceivably higher at higher currents than for curve 113. Specifically, the peak maximum oscillation frequency is observed to be about 10% higher in curve 103 than curve 112, and the peak collector current (related to the increased breadth) is observed to increase by 22%.

The improvements in performance metrics exhibited in FIGS. 2 and 3 for a device structure lacking trench isolation regions in the extrinsic device regions between adjacent emitter fingers may originate from reductions in the extrinsic base resistance and the extrinsic base-collector capacitance. In comparison with the prior art device structure, the device structure characterized by FIGS. 2, 3 exhibited a reduction in extrinsic base resistance of 10% and a reduction in the extrinsic base-collector capacitance of as much as 10%. A device structure with such improved performance metrics may exhibit faster operation.

Figure 4:
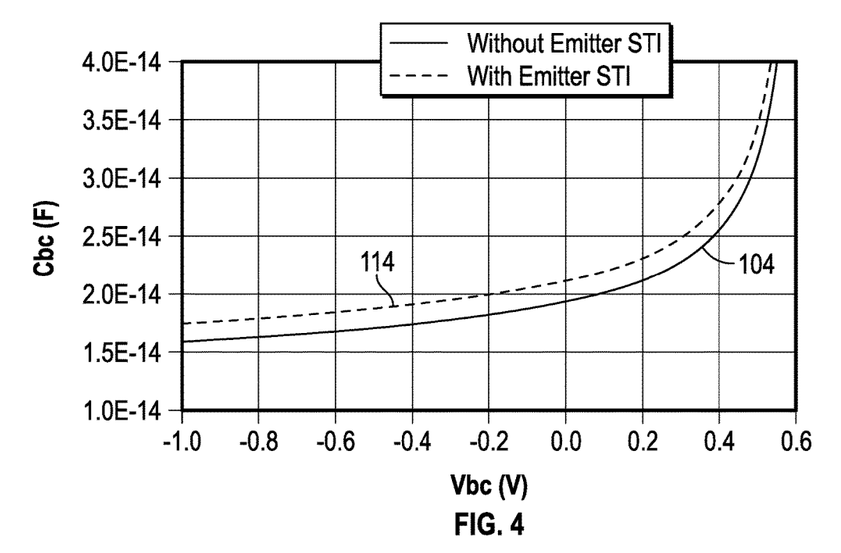
FIG. 4 is a graph plotting base-collector capacitance as a function of the base-collector junction bias for a device structure fabricated in accordance with an embodiment of the invention and a device structure fabricated in accordance with the prior art.

FIG. 4 is a graph plotting base-collector capacitance as a function of the base-collector junction bias for a device structure lacking trench isolation regions in accordance with an embodiment of the invention (curve 104) and a device structure including trench isolation regions in accordance with the prior art (curve 114). At all values of the base-collector junction bias, the base-collector capacitance of curve 104 is less than the base-collector capacitance of curve 114. This observation is attributable to eliminating the dielectric material characteristic of trench isolations between the extrinsic base and the collector.

Figure 5:
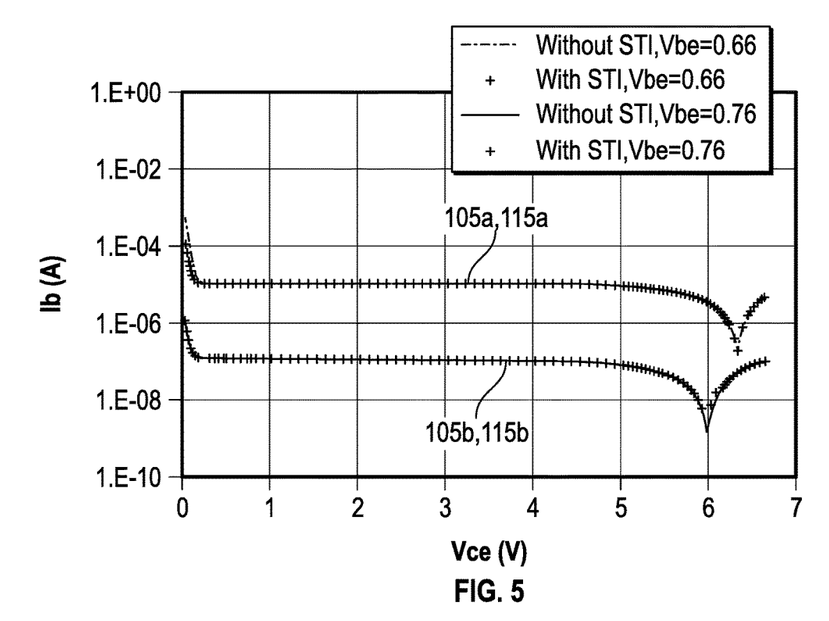
FIG. 5 is a graph plotting breakdown voltage as a function of the base-collector junction bias at two different base-emitter biases for a device structure fabricated in accordance with an embodiment of the invention and a device structure fabricated in accordance with the prior art.

FIG. 5 is a graph plotting breakdown voltage as a function of the base-collector junction bias at two different base-emitter biases for a device structure lacking trench isolation regions in accordance with an embodiment of the invention (curves 105a,105b) and a device structure device structure including trench isolation regions in accordance with the prior art (curve 115a,115b). Curves 105a, 115a for an base-emitter bias of 0.76 V overlap in the plot with nominal perceived differences. Likewise, curves 105b, 115b for an base-emitter bias of 0.66 V overlap in the plot with nominal perceived differences. The high level of overlap indicates that the elimination of the trench isolation regions does not impact the breakdown voltage.

Figure 6:
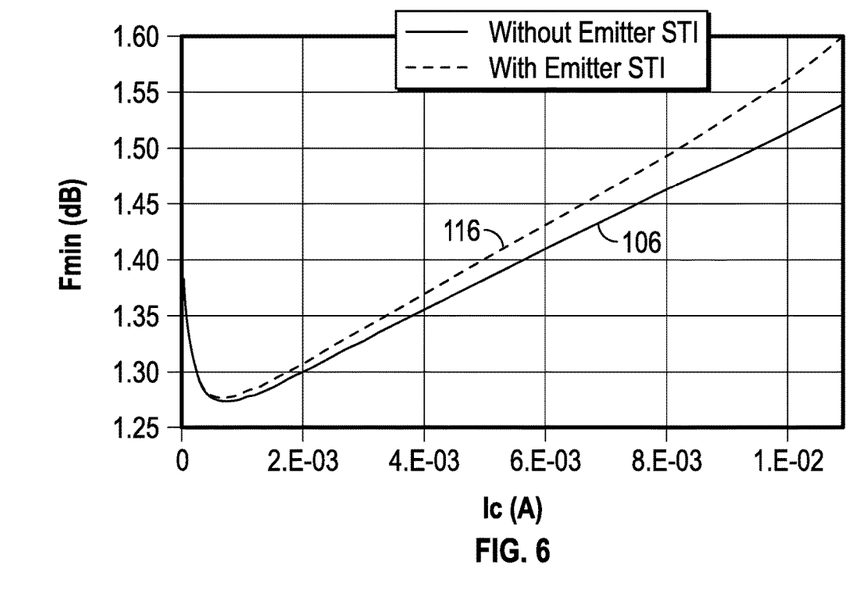
FIG. 6 is a graph plotting noise figure minimum as a function of the collector current for a device structure fabricated in accordance with an embodiment of the invention and a device structure fabricated in accordance with the prior art.

FIG. 6 is a graph plotting noise figure minimum (Nfmin) as a function of the collector current for a device structure lacking trench isolation regions in accordance with an embodiment of the invention (curve 106) and a device structure including trench isolation regions in accordance with the prior art (curve 116) as a function of collector current. Generally, device noise increases with increasing collector current. The device noise observed in curve 106 is less than the device noise in curve 116, which is believed to result from a decrease in the extrinsic base resistance.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refers to a direction perpendicular to the horizontal, as just defined. The term "lateral" refers to a dimension within the horizontal plane. Terms such as "above" and "below" are used to indicate positioning of elements or structures relative to each other as opposed to relative elevation.

A feature may be "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a substrate, the device structure comprising:
   one or more trench isolation regions in the substrate, the one or more trench isolation structures surrounding a device region having a portion;
   a base layer on the device region, the base layer including an intrinsic base and an extrinsic base on the portion of the device region, and the extrinsic base having a higher electrical conductivity than the intrinsic base;
   a plurality of contacts extending to a section of the extrinsic base on the portion of the device region; and
   a first emitter finger and a second emitter finger in a spaced relationship on the base layer,
   wherein the intrinsic base has a first section beneath the first emitter finger and a second section beneath the second emitter finger, the section of the extrinsic base is located laterally in the base layer between the first section of the intrinsic base and the second section of the intrinsic base, the portion of the device region extends from the first emitter finger to the second emitter finger, and the portion of the device region is free of a dielectric material.

2. The device structure of claim 1 wherein the portion of the device region is free of trench isolation regions comprising the dielectric material.

3. The device structure of claim 1 wherein the base layer has a uniform thickness.

4. The device structure of claim 1 wherein the first emitter finger is a dummy emitter that is not contacted during middle-of-line processing.

5. The device structure of claim 1 wherein the portion of the device region is located in an extrinsic device region between the first emitter finger and the second emitter finger.

6. The device structure of claim 1 wherein the base layer on the portion of the device region is comprised entirely of single crystal semiconductor material.

7. The device structure of claim 1 wherein the base layer on the portion of the device region is free of facets and is free of polycrystalline semiconductor material.

8. The device structure of claim 1 wherein the extrinsic base is located directly on the portion of the device region.

9. A method of fabricating a device structure, the method comprising:
   forming one or more trench isolation regions in a substrate to surround a device region;
   forming a base layer on the device region;
   forming a first emitter finger and a second emitter finger in a spaced relationship on the base layer;
   implanting a section of the base layer extending from the first emitter finger to the second emitter finger with an electrically-active dopant to define a section of an extrinsic base; and
   forming a plurality of contacts extending to the section of the extrinsic base on a portion of the device region,
   wherein the base layer further includes an intrinsic base and the extrinsic base has a higher electrical conductivity than the intrinsic base, the intrinsic base has a first section beneath the first emitter finger and a second section beneath the second emitter finger, the section of the extrinsic base is located laterally in the base layer between the first section of the intrinsic base and the second section of the intrinsic base, the portion of the device region extends from the first emitter finger to the second emitter finger, and the portion of the device region is free of a dielectric material.

10. The method of claim 9 wherein the portion of the device region is free of trench isolation regions comprising the dielectric material.

11. The method of claim 9 wherein the base layer has a uniform thickness.

12. The method of claim 9 wherein the first emitter finger is a dummy emitter that is not contacted during middle-of-line processing.

13. The method of claim 9 wherein the portion of the device region is an extrinsic device region between the first emitter finger and the second emitter finger.

14. The method of claim 9 wherein the base layer on the portion of the device region is comprised entirely of single crystal semiconductor material.

15. The method of claim 9 wherein the base layer on the portion of the device region is free of facets and is free of polycrystalline semiconductor material.

16. The method of claim 9 wherein the extrinsic base is formed directly on the portion of the device region.

* * * * *